United States Patent [19]

Letellier

[11] Patent Number: 4,676,992

[45] Date of Patent: Jun. 30, 1987

[54] PROCESS FOR THE DEPOSITION, ON OPTICAL SUBSTRATES, OF ANTIREFLECTION COATINGS CAPABLE OF BEING ENGRAVED

[75] Inventor: Michel Letellier, Paris, France

[73] Assignee: D.M.E., Paris, France

[21] Appl. No.: 776,778

[22] Filed: Sep. 17, 1985

[30] Foreign Application Priority Data

Sep. 19, 1984 [FR] France ................. 84 14369

[51] Int. Cl.$^4$ .................. B05D 5/06; C23C 16/40
[52] U.S. Cl. ........................ 427/9; 427/162;
427/166; 427/250; 427/255; 427/255.3;
427/255.7; 427/404; 427/419.2
[58] Field of Search ............ 427/9, 10, 162, 164,
427/166, 255, 250, 255.3, 255.7, 419.2, 404

[56] References Cited

U.S. PATENT DOCUMENTS

| | | | |
|---|---|---|---|
| 2,904,452 | 9/1959 | Reichelt | 427/166 |
| 3,208,873 | 9/1965 | Ames et al. | 427/166 |
| 3,698,928 | 10/1972 | Blome | 427/419.2 |
| 3,808,035 | 4/1974 | Stelter | 427/255.3 |
| 4,107,349 | 8/1978 | Vig | 427/9 |
| 4,172,356 | 10/1979 | Ritter et al. | 427/38 |
| 4,363,846 | 12/1982 | Kaneki | 427/166 |
| 4,428,980 | 1/1984 | Nakamura et al. | 427/166 |
| 4,430,366 | 2/1984 | Crawford et al. | 427/166 |

OTHER PUBLICATIONS

IBM Technical Disclosure Bulletin, vol. 13, No. 3, Aug. 1970, p. 752, New York, U.S., J. S. Judge et al: "Antireflective Chrome Photomasks".
Journal of the Electrochemical Society, vol. 121, No. 7, Jul. 1974, pp. 952-959; G. C. Fryburg et al.: "Enhanced Oxidative Vaporization of $Cr_2O_3$ and Chromium by Oxygen Atoms".
Optics and Laser Technology, vol. 4, No. 2, Apr. 1972, pp. 79-86; T. I. Putner: "The Vacuum Deposition of Metal Oxide Films by Automatic Control".
Chemical Abstracts, vol. 97, No. 22, Nov. 29, 1982, p. 190, ref. No. 185390w, Columbus, Ohio, U.S.; Chou, Bangwei et al.: "Evaporated Double-Layer Black Chrome Selective Coatings" & Taiyangneng Xuebao 1982, 3(2), 137-44.

*Primary Examiner*—Sadie L. Childs
*Attorney, Agent, or Firm*—Perry Carvellas

[57] ABSTRACT

A process for the deposition, on an optical substrate, of an antireflection coating capable of being engraved. In the process, metal is evaporated in a reactive atmosphere within the enclosure of an evaporator under vacuum and then deposited on the substrate. Previously cleaned substrates are disposed within the enclosure, which is then evacuated until a pressure of at most 1.5 $\mu$Pa ($10^{-8}$ torr) is obtained. Pure oxygen is injected at a regulated throughput in such a manner that the pressure is within the range of from 2 to 4 mPa, preferably 3 mPa ($2 \times 10^{-5}$ torr). A heated boat which is disposed within the enclosure and contains chromium is unmasked. The chromium evaporates at a temperature such that a coating of chromium oxide grows in thickness on the substrates at a rate of 0.1 to 0.5 nm per second, preferably 0.2 nm per second. The boat is masked when the coating of chromium oxide has reached a thickness corresponding to the first extinction in specular reflection at substantially normal incidence. The rate of growth is controlled with reference to the resonance drift of a quartz resonator which is also subjected to the deposit of chromium oxide. The extinction is monitored in white light at 3400° K. on a control substrate which has previously been metallized.

17 Claims, No Drawings

PROCESS FOR THE DEPOSITION, ON OPTICAL SUBSTRATES, OF ANTIREFLECTION COATINGS CAPABLE OF BEING ENGRAVED

BACKGROUND TO THE INVENTION

The invention relates to a process for the deposition, on optical substrates, of antireflection coatings capable of being chemically engraved, by evaporation of a metal in a reactive atmosphere within the enclosure of an evaporator under vacuum.

It is frequently necessary, in optical apparatus, to obtain reticules or frames which are opaque in a field in which an image is formed, in order to define a sighting axis, or to measure paraxial angles, for example. Direct engraving, such as diamond or chemical engraving, of an optical component, more especially a glass plate, has proved to be limited as regards accuracy and definition. In order to achieve the required opacity of the lines which is necesary in order to obtain good contrast, it is often required to fill the lines with a pigment. It has been found that this technique does not permit ultimate levels of resolution, which approach the wavelengths of the visible spectrum.

A technique which has been recommended is the deposition of opaque coatings by methods of deposition under vacuum, by evaporation or by cathodic atomisation, the pattern of the frame or reticule being obtained either by subsequent chemical engraving through a mask or micro-photolithography resist, or by carrying out of the depositing operation on a substrate covered by a mask similar to microphotolithographic masks.

U.S. Pat. No. 3808035 describes a method of deposition in the vapour phase, the deposit being formed by reaction, in contact, of the heated substrate formed of an evaporated compound with a reactive gas, which is diluted in a neutral carrier gas under a pressure close to atmospheric pressure. According to this document, the preferred coatings are metallic oxides, the reactive gas then containing a small quantity of oxygen or of a volatile oxidising agent. Compounds capable of evaporation are, inter alia, organo-metallic compounds, acetyl-acetonates for example, metal carbonyls or oxychlorides.

It will be noted that, according to this document, in order to obtain opaque coatings, reduction of the oxide which is deposited is carried out in order to form a reflecting metallic coating, the reduction being performed by adding to the carrier gas a reducing gas, such as hydrogen, carbon monoxide or methane.

It is clear that the reflections of the light on the frames or reticules cause losses of resolution or of contrast.

The use of coatings of a specific thickness, related to the wavelength, permits the elimination or at least the attenuation of the reflections of a metallic coating. In practice, although the deposition of an oxide coating having a controlled thickness on top of a metallic deposit permits the achievement of reflectances below 2% of the specular reflectance of the surface opposite the substrate, the reflectance at the substrate/deposit interface remains relatively high.

The processes for deposition according to the above-cited document are relatively slow (of the order of ten minutes for a single coating) and consume relatively large quantities of reagents and carrier gases.

An attempt has been made to obtain metallic oxide coatings by evaporation of the base metal in an oxidising atmosphere at pressures below 100 millipascals.

Titanium oxide appeared to be promising from this point of view. However, the chemical engraving solutions which are effective in the case of titanium oxide exhibit a significant degree of corrosiveness in relation to silica, which is a component of glass substrates.

SUMMARY OF THE INVENTION

According to the invention, there has been developed a process for the deposition, on an optical substrate, of an antireflection coating capable of being chemically engraved, by evaporation of a metal in a reactive atmosphere in an enclosure within an evaporator under vacuum, in which process a previously cleaned substrate is disposed within the enclosure, the enclosure is evacuated until a pressure of at most 1.5 $\mu$Pa is obtained, pure oxygen is injected into the enclosure at a controlled throughput in such a manner that the pressure is in the range of from 2 to 4 mPa, a heated boat is unmasked, the boat being disposed within the enclosure and containing chromium at a temperature such that a layer of chromium oxide grows in thickness on the substrate at a rate of 0.1 to 0.5 nm per second, and the boat is masked when the coating of chromium oxide has reached a thickness corresponding to the first extinction in specular reflection at substantially normal incidence.

This process can permit deposits of chromium oxide to be obtained which have an optical density close to 2 and a reflection factor of the order of 1% at 550 nm and of the order of 20 to 30% at the extremities of the range of 400–700 nm (experimental values).

It will be noted that the reproducibility of the results of the process has been assured by the determination of each one of the deposit parameters, the influences of these various parameters not being independent.

It should be noted that the optical densiy corresponds to the ratios of the incident and transmitted luminous intensities a densiy of 2 representing a ratio of $10^2$. The reflection factors given are in relation to the specular reflection.

Preferably, the growth in thickness of the deposited coating is controlled by measurement of the resonance frequency drift of a quartz plate resonator, one surface of this plate being exposed to the deposit under substantially the same conditions as the substrate. The principle of this control process is known. The mass of chromium oxide which is deposited modifies the mechanical resonance frequency of the quartz plate.

Likewise, preferably a determination is made of the instant at which it is necessary to mask the oat containing the chromium in order to arrest the growth of the deposited oxide coating, by practical elimination of the reflectance of a control substrate which is also subjected to the deposit and has been previously covered with a metallic coating exhibiting specular reflection, that is to say when this reflectance is below 2% of the specular reflectance. It will be recalled that the elimination of the reflectance is produced by interference in the opposite phase of the rays which are reflected by the two surfaces of the chromium oxide coating, and is strictly only complete in the case of a single frequency. Just before being eliminated, the reflected light of a white source adopts characteristic colorations. Such elimination corresponds to what is known as the shift to the sensitive coloration.

In order to control the elimination of the reflectance, the procedure is preferably carried out with a source of white light at a colour temperature of 3400 K.

If it is desired to go beyond the transmission density of 2, the deposition of metallic chromium is carried out under exhaustive vacuum. The deposit of metallic chromium is situated between the substrate and chromium oxide coating when the reflectance is desired to be practically zero as seen from the side of the deposit, and on the chromium oxide coating if the reflectance is desired to be practically zero as seen from the side of and through the substrate. If it is desired that the reflectance should be practically zero as seen from both sides of the substrate, the deposit of metallic chromium is effected on a first coating of chromium oxide and then a second coating of chromium oxide is deposited on top of the deposit of metallic chromium.

From the side of observation, the coating of chromium oxide practically eliminates the reflectance of the deposit of metallic chromium, while the transmission density of this deposit is added to the density which is specific to the chromium oxide.

It will be noted that in this manner it is eay to achieve densities of at least 4. Transmission factors below $10^{-4}$ can not be measured for practical purposes.

DESCRIPTION OF THE PREFERRED EMBODIMENTS

The characteristics and advantages of the invention will be evident from the description which follows and which constitutes an example of the invention.

The deposition process is carried out in a vacuum deposition apparatus which is entirely traditional and which is of the kind marketed by various manufacturers of vacuum equipment.

In order to produce reticules for precision optical apparatus, use is made of glass substrates of optical quality, which are cleaned chemically in a known manner, rinsed with demineralised water, and dried by immersion in acetone and heating in an autoclave at 70°-80° C.

A plurality of the substrates are supported at target positions on the plate of a vacuum evaporation apparatus. A boat which is provided with a heating means operating by the Joule effect and which is provided with a screen or mask which can be manipulated from outside is filled with pulverulent pure chromium. A quartz resonator is disposed between the substrates, a suitable resonator being one which is supplied by the company Leybold, and the resonator is connected to its excitation and measurement circuits via isolated sealed passages of the plate. A substrate, which is referred to as a control substrate is likewise located on the plate. The control substrate has had formed thereon a metallic deposit exhibiting specular reflection. The enclosure of the evaporator is closed, and pumping of the enclosure is commenced, initially to the level of primary vacuum (preliminary evacuation), and then the preliminary evacuation valve is closed and the secondary vacuum valve is opened.

Autoclaving is then carried out at a temperature which is appropriate to the substrates to be coated, and for a length of time such that the pressure, after a flat stage which corresponds to the evaporation of the water on the surface of the substrates, starts clearly to decrease. Autoclaving is then stopped, and degassing of the boat and of its contents is carried out at a temperature of about 700° C. with brief unmasking of the boat until such time as the pressure in the enclosure, after a temporary rise, resumes its decrease.

The pressure in the enclosure is monitored with the aid of the gauges with which the evaporation apparatus is provided. When the pressure has dropped to 1.5 μPa, the procedure passes on to the following phase. The vacuum gauges are frequently graduated in torr; it has been found that pumping to $10^{-8}$ torr is sufficient. It will be understood that, although $10^{-8}$ torr corresponds to 1.3 μPa, the accuracy of the gauges may not be sufficient for the difference in reading between 1.3 and 1.5 μPa to be significant.

For the deposition phase, pure oxygen is injected through a micrometer valve, referred to as a needle valve, without interrupting the pumping, the throughput of oxygen being regulated in order that the pressure is in the range of from 2 to 4 mPa, the preferred pressure being 3 mPa ($2 \times 10^{-5}$ torr).

It should be understood that on the first occasion that the apparatus is used, and also when th oxygen cylinder is changed, rinsing with oxygen is carried out in the course of the primary vacuum stage.

With oxygen at a pressure of 2-4 mPa, the boat containing the chromium is unmasked in order that the chromium metal evaporates and is subsequently deposited on the substrates in a condition combined with the oxygen. The supply voltage of the heating element of the boat which contains the chromium is regulated in order that the rate of deposition should be set at a value within the range of from 0.1 to 0.5 nm, per second preferably at a value of 0.2 nm per second. This rate is controlled with the aid of the quartz resonator, which receives on its upper surface the same deposit as the substrates. The coloration adopted by the control substrate is monitored. When the deposit appears yellow as seen in reflected light, the reflection is measured by illuminating this control with white light (from a halogen lamp at 3400 K) and measuring the reflected intensity with a graduated photodiode monitoring the control subtrate through a filter centered on 550 nm. The deposition is arrested by masking the boat when the reflection factor measured by the photodiode is below 2% of the specular reflection factor. In white light, the deposit appears black intermediate between yellow and cyan (in fact, the deposit is not allowed to grow until a cyan coloration is obtained). The injection of oxygen is then shut off.

The duration of deposition under the operating conditions as described is approximately 200 seconds. The tolerance of the duration is approximately 10 seconds.

After a period of cooling, the vacuum is deactuated within the enclosure, and the substrates are ready for engraving.

The optical monitoring of the coated substrates at this stage shows that in transmission the deposit exhibits an optical density. of 2. In reflection at 550 nm the reflection factor is approximately 1%, and this rises to 20 to 30% at the extremities of the visible spectrum (400 and 700 nm).

In circumstances in which it is desired to obtain a density of opacity in transmission exceeding 2, deposition of metallic chromium is carried out. For the deposition of metallic chromium, the procedure is carried out under high vacuum, of the order of 1.5 μPa, and the boat is unmasked for a suitable period of time corresponding to the density of opacity which is required. If the deposition of metallic chromium is carried out directly on the substrate, a determination will be made of the opacity of the metallic chromium deposit by taking account of the fact that the deposit of oxide will itself exhibit a density of 2. With the deposit of metallic chromium on the substrate, the coating of the substrate will be reflecting as seen through the substrate and non-reflecting as seen from the side of the deposit of chromium oxide. If the deposit of metallic chromium on the chromium oxide coating is carried out by unmasking the boat again after the chromium oxide coating has been formed, and the oxygen has been evacuated after closing of the needle valve, the entire deposit will appear as reflecting from the side of the deposit and non-reflecting as seen through the substrate.

Finally, if a first coating of chromium oxide is deposited, a deposition of metallic chromium is effected on this first chromium oxide coating, and then a second coating of chromium oxide is deposited on the metallic chromium under the same conditions as the first one, the coating of the substrate will be opaque and non-reflecting as seen from both sides.

In order to construct a reticule, the substrates carrying chromium oxide are covered with a photosensitive resin and exposed through an appropriate mask. The exposed resin is stipped, and then the deposit is engraved, all these processes being known in microphotolithography. However, by virtue of the reduced thickness of the deposit (approximately 50 nm), it is possible to achieve extremely fine lines by engraving. Furthermore, all the processes, being capable of imparting to the masks and to the exposed areas an excellent level of resolution, close to the resolution of diffraction, cooperate with the process of the invention in order to achieve the production of reticules of very high accuracy.

However, it should be understood that the entire process of engraving is outside the scope of the present invention.

What I claim is:

1. A process for the deposition of a chemically engraveable antireflective coating on an optical substrate, wherein the process comprises the steps of:
   introducing at least one clean substrate in an enclosure; evacuating the enclosure to a pressure of at most 1.5 Pa; injecting pure oxygen into the enclosure at a controlles flow rate such that the pressure is in the range of about 2 to about 4 mPa; unmasking a heated boat placed inside the enclosure and containing chromium, for evaporation of the chronium;
   controlling the temperature of the chronium so that a coating of chronium oxide grows in thickness on the substrate at a rate of about 0.1 to 0.5 nm per second to a thickness of about 50 nm; determining a reflection factor of the growing coating, relative to specular reflection, at a substanially normal incidence in white light; and masking the boat when the reflection factor is below two percent.

2. A process according to claim 1, further comprising controlling the temperature of the chromium in the boat so that the chromium oxide grows in thickness at the rate of 0.2 nm per second.

3. A process according to claim 1, further comprising subjecting a quartz resonator disposed inside the enclosure to substantially the same conditions as the substrate so that a coating of ohromium oxide is deposited thereon, and measuring the resonance frequency drift of the quartz resonator to delermine the rate oF growth of the thickness of the chromium oxide.

4. A process according to claim 1, further comprising preparing a control substrate having a metallic coating exhibiting specular relection; introducing the control substrate into the enclosure and determining the reflectance of the control substrate, and masking the boat when the reflectance of the control substrate is below 2% of the specular reflectance of the coated substrate at a selected wavelength.

5. A process according to claim 4, further comprising controlling the temperature of the chromium in the boat so that the chromium oxide grows in thickness at the rate of 0.2 nm per second.

6. A process according to claim 4, further comprising subjecting a quartz resonator disposed inside the enclosure to substantially the same conditions as the substrate so that a coating of chromium oxide is deposited thereon and measuring the resonance frequency drift of the quartz resonator to determine the rate oF growth of the thickness of the chromium oxide.

7. A process according to claim 4, further comprising determining the reflectance of the control substrate with a source of white light at a color temperature of 3400 K.

8. A process according to claim 1, wherein before the deposition of the chromium oxide a coating of metallic chronium is deposited under high vacuum conditions on a side of the substrate, then depositing the said chromium oxide on the metallic chronium coating so as to obtain a high degree of opacity and for observation from the side on which the chromium and chromium oxide are deposited and to obtain a transmission density of at least 4.

9. A process according to claim 1, further comprising depositing under high vacuum conditions mettallic chromium on the deposited chromium oxide for obtaining a coating having a high degree of opacity for observation from the side opposite the deposited chromium oxide and chromium and to obtain a transmission density of at least 4.

10. A process according to claim 1, further comprising depositing metallic chromium under high vacuum conditions on the coating of chromium oxide and then depositing another coating of chromium oxide on top of the deposited metallic chromium for providing a compound coating having a high degree of opacity and for observation from both sides oF the substrate.

11. A process according to claim 8, further comprising controlling the thickness of the metallic chromium so that the metallic chromium has a transmission density which supplements the transmission density specific to the chromium oxide coating so that the resultant coating on the substrate has the desired density.

12. A process according to claim 9, further comprising controlling the thickness of the metallic chromium so that the metallic chromium has a transmission density which supplements the transmission density specific to the chromium oxide coating so that the resultant coating on the substrate has the desired density.

13. A process according to claim 10, further comprising controlling the thickness of the metallic chromium so that the metallic chromium has a transmission density which supplements the transmission density specific to the chromium oxide coating so that the resultant coating on the substrate has the desired density.

14. A process according to claim 1 wherein the chromium oxide layer is deposited in about 200 seconds.

15. A process according to claim 8 wherein the metallic chromium layer is deposited at a pressure of about 1.5 $\mu$Pa.

16. A process according to claim 9 whrein the metallic chromium layer is deposited at a pressure of about 1.5 $\mu$Pa.

17. A process according to claim 10 wherein the metallic chromium layer is deposited at a pressure of about 1.5 $\mu$Pa.

* * * * *

UNITED STATES PATENT AND TRADEMARK OFFICE
CERTIFICATE OF CORRECTION

PATENT NO. : 4,676,992
DATED : Jun. 30, 1987
INVENTOR(S) : Michel Letellier

It is certified that error appears in the above-identified patent and that said Letters Patent is hereby corrected as shown below:

Col. 2, line 53, "oat" should read --boat--.

Col. 5, line 23, "stipped" should read --stripped--.

Col. 5, line 51, claim 1, "substanially" should read --substantially--.

Col. 6, line 28, claim 9, "mettallic" should read --metallic--.

Signed and Sealed this

Eighth Day of December, 1987

Attest:

DONALD J. QUIGG

Attesting Officer

Commissioner of Patents and Trademarks